(12) United States Patent
Piirainen

(10) Patent No.: US 7,643,801 B2
(45) Date of Patent: Jan. 5, 2010

(54) CLIPPING OF TRANSMISSION SIGNAL

(75) Inventor: Olli Piirainen, Oulu (FI)

(73) Assignee: Nokia Siemens Networks Oy, Espoo (FI)

( * ) Notice: Subject to any disclaimer, the term of this patent is extended or adjusted under 35 U.S.C. 154(b) by 649 days.

(21) Appl. No.: 11/074,006

(22) Filed: Mar. 8, 2005

(65) Prior Publication Data

US 2006/0154622 A1  Jul. 13, 2006

(30) Foreign Application Priority Data

Jan. 7, 2005 (FI) .................................. 20055012

(51) Int. Cl.
*H04B 1/04* (2006.01)
(52) U.S. Cl. .................. 455/114.2; 375/296; 375/297; 455/114.3
(58) Field of Classification Search .......... 455/114.2, 455/114.3; 375/296, 297; 330/149, 151
See application file for complete search history.

(56) References Cited

U.S. PATENT DOCUMENTS

| | | | | |
|---|---|---|---|---|
| 5,760,646 A * | 6/1998 | Belcher et al. | ............ | 330/149 |
| 5,877,653 A * | 3/1999 | Kim et al. | ............ | 330/149 |
| 6,240,278 B1 * | 5/2001 | Midya et al. | ............ | 455/126 |
| 6,275,103 B1 * | 8/2001 | Maniwa | ............ | 330/149 |
| 6,356,606 B1 * | 3/2002 | Hahm | ............ | 375/350 |
| 6,437,644 B1 * | 8/2002 | Kenington | ............ | 330/149 |
| 6,504,862 B1 * | 1/2003 | Yang | ............ | 375/146 |
| 6,574,458 B1 * | 6/2003 | Bargauan | ............ | 455/114.2 |
| 6,577,192 B2 * | 6/2003 | Maniwa et al. | ............ | 330/149 |
| 6,621,340 B1 * | 9/2003 | Perthold et al. | ............ | 330/149 |
| 6,654,427 B1 * | 11/2003 | Ma et al. | ............ | 375/297 |
| 6,756,845 B1 * | 6/2004 | Mashhour | ............ | 330/149 |
| 6,801,086 B1 * | 10/2004 | Chandrasekaran | ............ | 330/140 |
| 6,931,239 B2 * | 8/2005 | Hongo et al. | ............ | 455/103 |
| 7,013,161 B2 * | 3/2006 | Morris | ............ | 455/522 |
| 7,053,709 B1 * | 5/2006 | Darvish-Zadeh et al. | ............ | 330/149 |
| 7,149,257 B2 * | 12/2006 | Braithwaite | ............ | 375/296 |
| 7,170,342 B2 * | 1/2007 | Suzuki et al. | ............ | 330/149 |
| 7,170,345 B2 * | 1/2007 | Hongo | ............ | 330/149 |
| 7,170,346 B2 * | 1/2007 | Jelonnek et al. | ............ | 330/151 |
| 7,170,951 B1 * | 1/2007 | Perthold et al. | ............ | 375/296 |
| 7,170,952 B2 * | 1/2007 | Hunton | ............ | 375/296 |

(Continued)

FOREIGN PATENT DOCUMENTS

EP    0 751 630 B1    1/1997

(Continued)

*Primary Examiner*—Lana N Le
*Assistant Examiner*—RuiMeng Hu
(74) *Attorney, Agent, or Firm*—Squire, Sanders & Dempsey, LLP

(57) ABSTRACT

A transmitter clips a transmission signal before transmission in order to reduce the strength of at least one peak of the transmission signal exceeding a predetermined threshold. The transmitter includes a clipper having a minimizer, a filter and an adder. The minimizer minimizes of a cost function with respect to an optimization signal, the cost function having weighted terms as a function of the optimization signal. The terms relate to an effective modulation distortion and an effective overshoot exceeding the predetermined threshold. The filter forms a clipping signal by filtering the optimization signal formed as a result of the minimization according to the spectrum emission mask requirements of the radio system. The adder subtracts the clipping signal from the transmission signal.

27 Claims, 5 Drawing Sheets

U.S. PATENT DOCUMENTS

Figure 1:
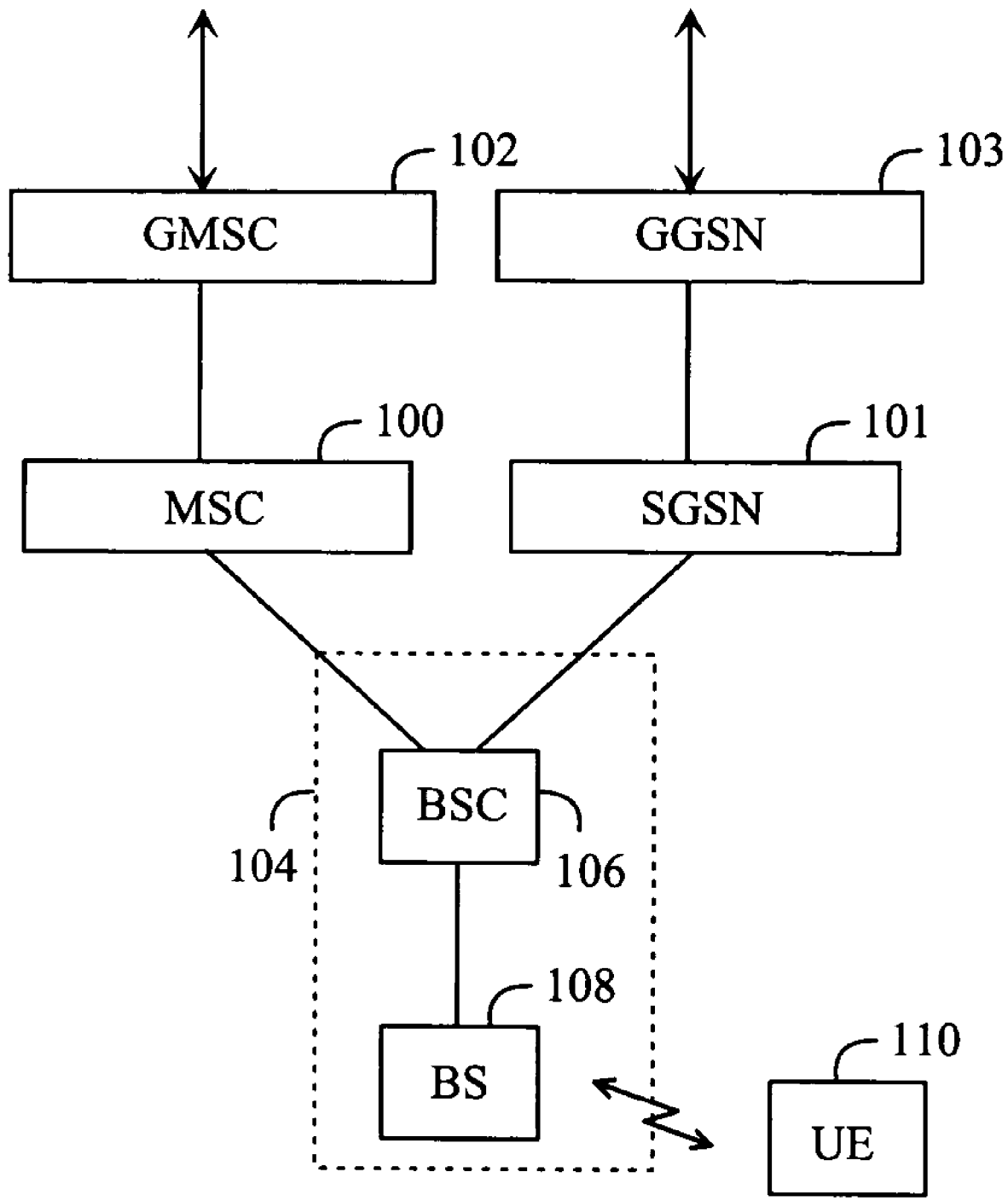

| | | | |
|---|---|---|---|
| 7,212,583 B2* | 5/2007 | Lindh | 375/296 |
| 7,268,620 B2* | 9/2007 | Nygren et al. | 330/149 |
| 7,330,704 B2* | 2/2008 | Archer | 455/114.3 |
| 2002/0042253 A1* | 4/2002 | Dartois | 455/127 |
| 2002/0079965 A1* | 6/2002 | Maniwa et al. | 330/149 |
| 2002/0196863 A1* | 12/2002 | Kaku et al. | 375/285 |
| 2002/0197970 A1* | 12/2002 | Jian et al. | 455/245.2 |
| 2003/0086507 A1* | 5/2003 | Kim et al. | 375/297 |
| 2003/0223508 A1* | 12/2003 | Ding et al. | 375/296 |
| 2004/0083100 A1* | 4/2004 | Burnett et al. | 704/233 |
| 2004/0090283 A1* | 5/2004 | Naito | 333/17.2 |
| 2004/0101062 A1* | 5/2004 | Lindh | 375/261 |
| 2004/0223558 A1* | 11/2004 | Brown et al. | 375/296 |
| 2004/0234006 A1* | 11/2004 | Leung | 375/316 |
| 2004/0264595 A1* | 12/2004 | Kim | 375/296 |
| 2005/0163248 A1* | 7/2005 | Berangi et al. | 375/296 |
| 2005/0169411 A1* | 8/2005 | Kroeger | 375/350 |
| 2005/0185736 A1* | 8/2005 | Pajukoski | 375/296 |
| 2006/0091949 A1* | 5/2006 | Smithson | 330/149 |
| 2006/0120479 A1* | 6/2006 | Cai et al. | 375/296 |
| 2008/0007334 A1* | 1/2008 | Manku | 330/149 |

FOREIGN PATENT DOCUMENTS

| | | |
|---|---|---|
| EP | 1 282 225 A2 | 2/2003 |
| EP | 1 396 970 B1 | 3/2004 |
| EP | 1 424 822 A2 | 6/2004 |
| WO | WO 02/11283 A2 | 2/2002 |

* cited by examiner

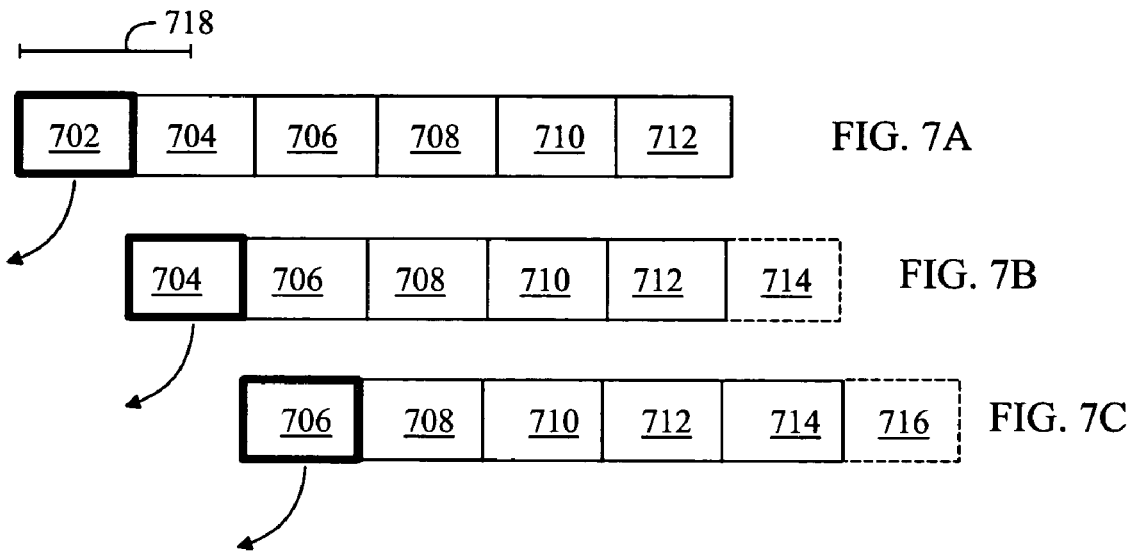
FIG. 7A
FIG. 7B
FIG. 7C
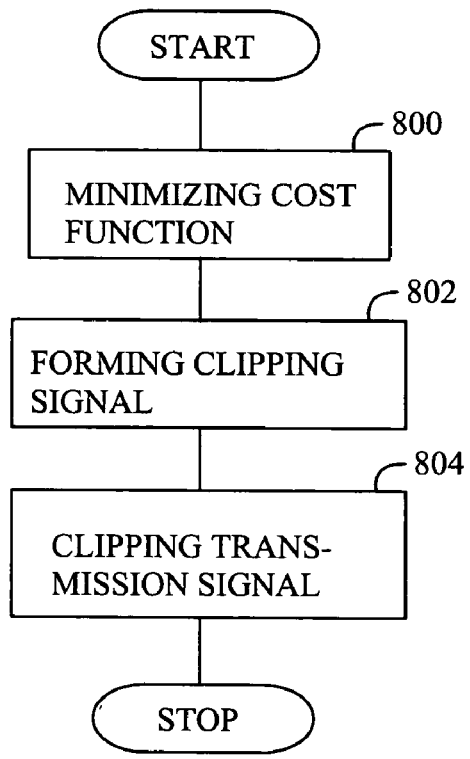
FIG. 8

CLIPPING OF TRANSMISSION SIGNAL

FIELD

The invention relates to restriction of strength of a signal in a radio transmitter.

BACKGROUND

In a radio system linearity of a power amplifier limits the obtainable maximum transmit power, especially when the signal to be transmitted has a high peak to average power ratio (PAPR). In such a case the signal input to the power amplifier may exhibit momentarily high power that must be taken into account in designing the power amplifier. This means in practice that an output signal of the amplifier is scaled down to a lower power level in order to meet the spectral requirements of the data transmission system currently in use. Due to this, the signal to be amplified is biased such that the transfer function of the amplifier becomes more linear. However, this reduces the efficiency of the amplifier and/or the transmitter. Secondly, power amplifiers with a broad linear operating range are expensive.

Signal components exceeding a threshold can also be clipped by limiting the peak values to the threshold. The other signal values below the threshold are not changed. However, a problem with the clipping methods is that the signal frequency spectrum spreads, i.e. usually the spectrum spreads beyond the frequency band that is used, thus causing interference to other users. If the spreading of spectrum is limited, the PAPR remains high.

BRIEF DESCRIPTION OF THE INVENTION

An object of the invention is to provide an improved method, an improved transmitter, and an improved base station. According to an aspect of the invention, there is provided a method of clipping a transmission signal in a radio system, the method comprising clipping a transmission signal in the transmitter before transmission in order to reduce the strength of at least one peak of the transmission signal exceeding a predetermined threshold. The method further comprises performing a minimization of a cost function with respect to an optimisation signal, the cost function having weighted terms as a function of the optimisation signal, the terms relating to an effective modulation distortion and an effective overshoot exceeding the predetermined threshold; forming a clipping signal by filtering the optimisation signal formed as a result of the minimization according to the spectrum emission mask requirements of the radio system; and subtracting the clipping signal from the transmission signal.

According to another aspect of the invention, there is provided a transmitter in a radio system, the transmitter being configured to clip a transmission signal before transmission in order to reduce the strength of at least one peak of the transmission signal exceeding a predetermined threshold. The transmitter further comprises a clipper comprising a minimizer for minimizing of a cost function with respect to an optimisation signal the cost function having weighted terms as a function of the optimisation signal, the terms relating to an effective modulation distortion and an effective overshoot exceeding the predetermined threshold; a filter for forming a clipping signal by filtering the optimisation signal formed as a result of the minimization according to the spectrum emission mask requirements of the radio system; and an adder for subtracting the clipping signal from the transmission signal.

According to another aspect of the invention, there is provided a base station in a radio system, the base station being configured to clip a transmission signal before transmission in order to reduce the strength of at least one peak of the transmission signal exceeding a predetermined threshold. The base station further comprises a minimizer for minimizing of a cost function with respect to an optimisation signal the cost function having weighted terms as a function of the optimisation signal, the terms relating to an effective modulation distortion and an effective overshoot exceeding the predetermined threshold; a filter for forming a clipping signal by filtering the optimisation signal formed as a result of the minimization according to the spectrum emission mask requirements of the radio system; and an adder for subtracting the clipping signal from the transmission signal.

According to another aspect of the invention, there is provided a transmitter in a radio system, the transmitter being configured to clip a transmission signal before transmission in order to reduce the strength of at least one peak of the transmission signal exceeding a predetermined threshold. The transmitter further comprises means for minimizing of a cost function with respect to an optimisation signal the cost function having weighted terms as a function of the optimisation signal, the terms relating to an effective modulation distortion and an effective overshoot exceeding the predetermined threshold; means for forming a clipping signal by filtering the optimisation signal formed as a result of the minimization according to the spectrum emission mask requirements of the radio system; and means for subtracting the clipping signal from the transmission signal.

According to another aspect of the invention, there is provided a computer program product encoding a computer program of instructions for executing a computer process for clipping a transmission signal in a transmitter of a radio system before transmission in order to reduce the strength of at least one peak of the transmission signal exceeding a predetermined threshold. The computer process further comprising: performing a minimization of a cost function with respect to an optimisation signal the cost function having weighted terms as a function of the optimisation signal, the terms relating to an effective modulation distortion and an effective overshoot exceeding the predetermined threshold; forming a clipping signal by filtering the optimisation signal formed as a result of the minimization according to the spectrum emission mask requirements of the radio system; and subtracting the clipping signal from the transmission signal.

According to another aspect of the invention, there is provided a computer program distribution medium readable by a computer and encoding a computer program of instructions for executing a computer process for clipping a transmission signal in the transmitter of a radio system before transmission in order to reduce the strength of at least one peak of the transmission signal exceeding a predetermined threshold. The computer process further comprising: performing a minimization of a cost function with respect to an optimisation signal the cost function having weighted terms as a function of the optimisation signal, the terms relating to an effective modulation distortion and an effective overshoot exceeding the predetermined threshold; forming a clipping signal by filtering the optimisation signal formed as a result of the minimization according to the spectrum emission mask requirements of the radio system; and subtracting the clipping signal from the transmission signal.

The invention provides several advantages. The PAPR can be effectively lowered without unnecessarily spreading the spectrum beyond the allowable frequency band.

LIST OF DRAWINGS

Figure 2:
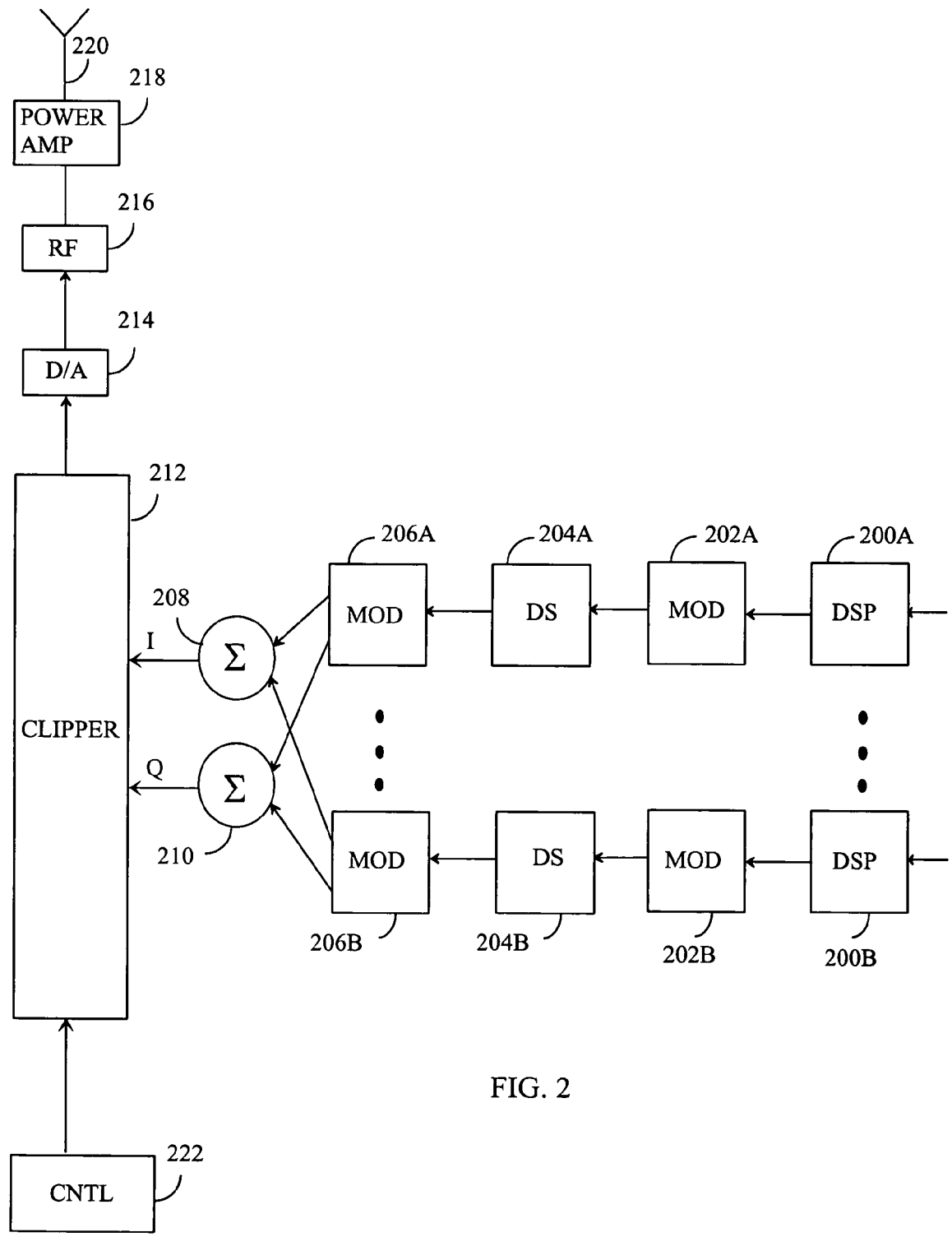
Figure 3A:
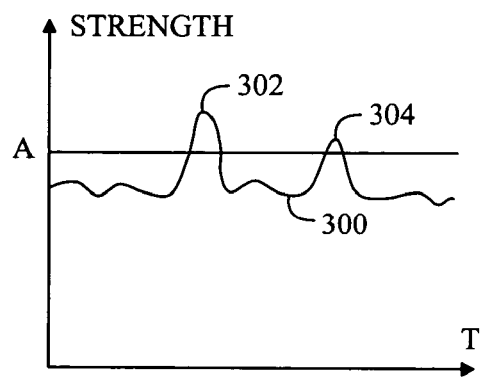
Figure 3B:
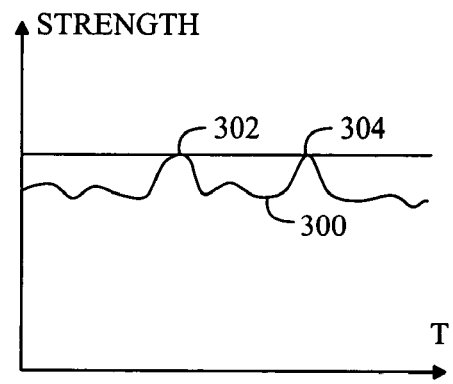
Figure 4:
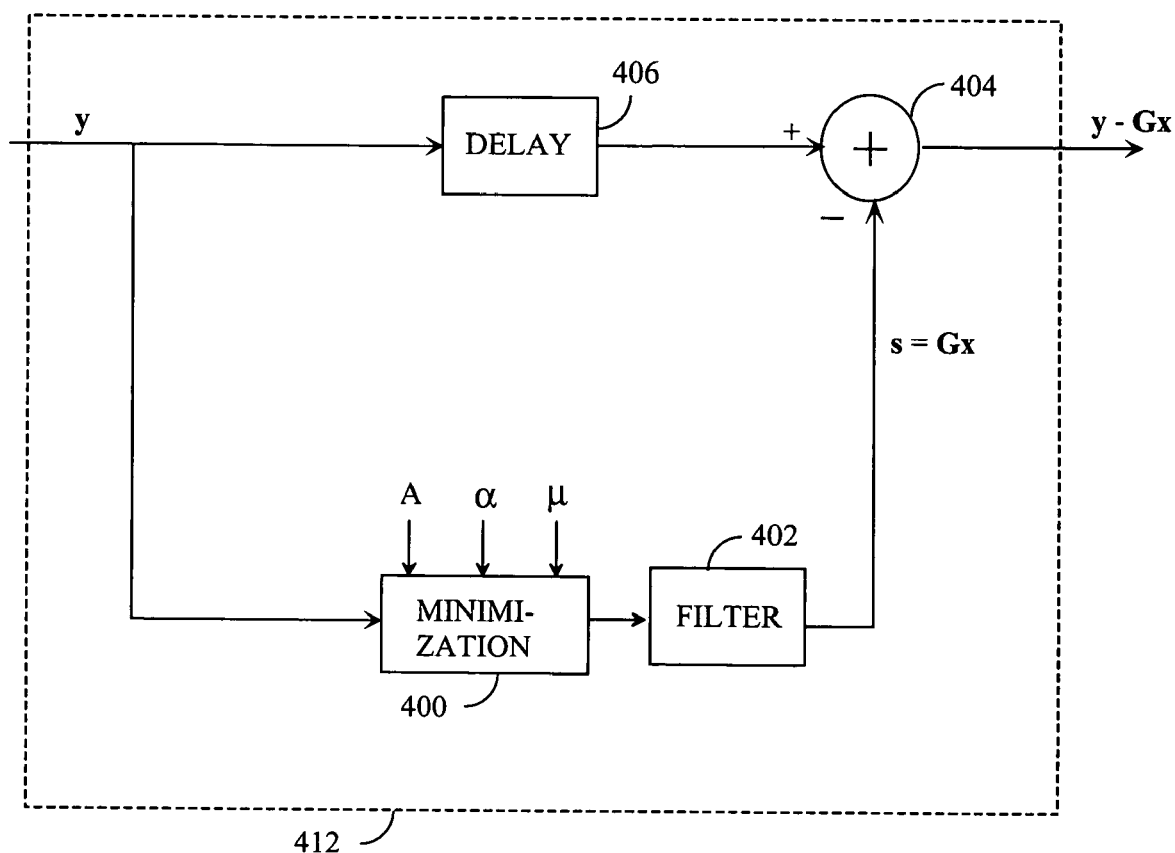
Figure 5:
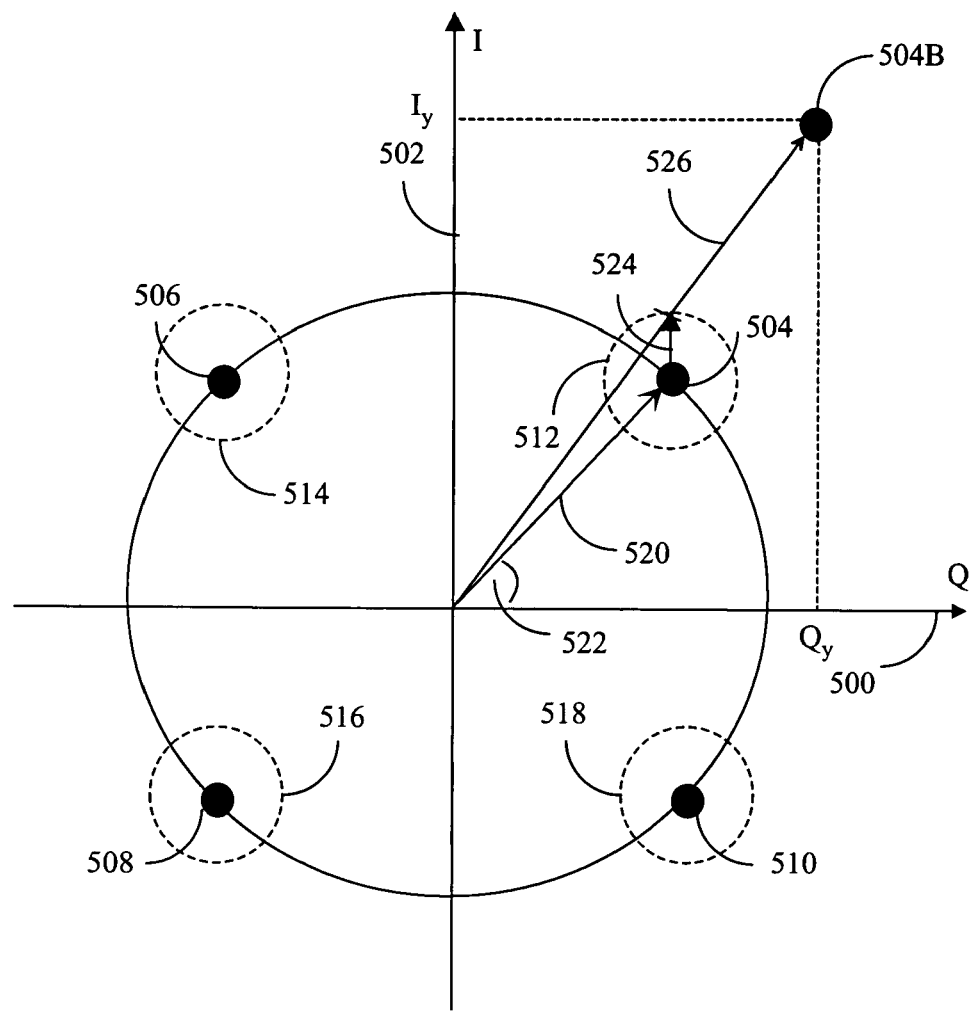
Figure 6:
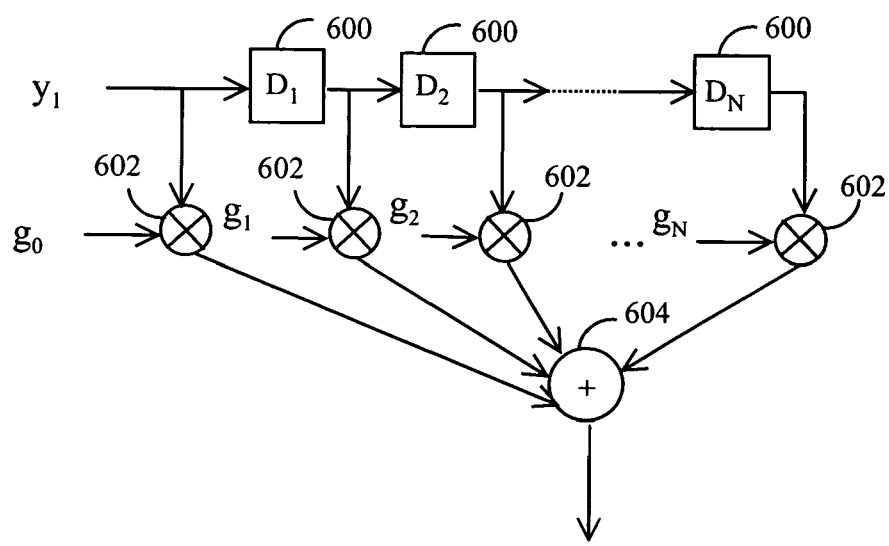

In the following, the invention will be described in greater detail with reference to the embodiments and the accompanying drawings, in which FIG. 1 shows a radio system,
FIG. 2 illustrates a transmitter,
FIG. 3A illustrates a transmission signal with high peaks,
FIG. 3B illustrates a clipped transmission signal,
FIG. 4 illustrates a clipper,
FIG. 5 illustrates a signal constellation,
FIG. 6 illustrates a FIR filter,
FIGS. 7A-7C illustrate division of a transmission signal into subsignals, and
FIG. 8 illustrates a flow chart of the method.

DESCRIPTION OF EMBODIMENTS

Let us first study FIG. 1 that illustrates the structure of a radio system. The radio system can be based on, for example, UMTS (Universal Mobile Telephone System) or WCDMA (Wide-band Code Division Multiple Access).

The core network may, for example, correspond to the combined structure of the GSM (Global System for Mobile Communications) and GPRS (General Packet Radio Service) systems. The GSM network elements are responsible for the implementation of circuit-switched connections, and the GPRS network elements for the implementation of packet-switched connections, some of the network elements being, however, shared by both systems.

A mobile services switching centre (MSC) 100 enables circuit-switched signalling in the radio system. A serving GPRS support node (SGSN) 101 in turn enables packet-switched signalling. All traffic in the radio system may be controlled by the MSC 100.

The core network may have a gateway unit 102, which represents a gateway mobile service switching centre (GMSC) for attending to the circuit-switched connections between the core network and external networks, such as a public land mobile network (PLMN) or a public switched telephone network (PSTN). A gateway GPRS support node (GGSN) 103 attends to the packet-switched connections between the core network and external networks, such as the Internet.

The MSC 100 and the SGSN are connected to a radio access network (RAN) 104, which may comprise at least one base station controller 106 controlling at least one base station 108. The base station controller 106 can also be called a radio network controller, and the base station can be called a node B. A user terminal 110 communicates with at least one base station 108 over a radio interface.

The user terminal 110 can communicate with the base station 108 using a GPRS method. Data in packets contain address and control data in addition to the actual traffic data. Several connections may employ the same transmission channel simultaneously.

Orthogonal frequency division multiplexing (OFDM) scheme is also an option for communication between the base station and the user terminal. In the OFDM technique data is transmitted using a plurality of subcarriers instead of one wideband signal. The OFDM scheme combined with CDMA scheme has a tendency to produce high peaks to mean amplitude.

FIG. 2 illustrates a transmitter in the radio system. The transmitter is usually the base station of the radio system but it may also be some other transmitter of the radio system. The transmitter can be a single carrier transmitter or a multicarrier transmitter. The multicarrier transmitter includes the signal-processing units 200A to 200B, data modulators 202A to 202B, spreading units 204A to 204B, and modulators 206A to 206B. The number of the carriers required in a multicarrier system may vary in different applications.

The signal-processing units 200A to 200B, which may be digital signal processors (DSP), process user speech or data in the transmitter. The signal processing may include, for example, coding and encryption. If the transmission is carried out in frames, which consist of time slots, the frames are typically formed and symbols can also be interleaved in the DSP. The purpose of signal coding and interleaving is to ensure that the transmitted information can be restored in the receiver in spite of loss of information during fading. In data modulators 202A to 202B, the data signal is modulated by a desired modulation method. A possible modulation method is, for example, quadrature phase shift keying (QPSK) where the signal is divided into in-phase I and quadrature Q components.

In the spreading units 204A to 204B, the narrowband data signal is multiplied by a spreading code in order to spread the band.

The modulators 206A to 206B which may perform IDFT (Inverse Discrete Fourier Transform) or IFFT (Inverse Fast Fourier Transform) are needed if a transmitter is a multicarrier transmitter. A single carrier transmitter does not have the modulators 206A to 206B. The modulators 206A to 206B form a plurality of carriers organized on the frequency domain in a manner applicable to the system used. This kind of multicarrier CDMA transmitter based on an OFDM scheme is an example of a multicarrier transmitter.

Since the signal may have the in-phase (I) and quadrature (Q) component after each modulator 206A to 206B, the multicarrier transmitter comprises two adders 208, 210, one of which adds the in-phase components of the different carriers together and the other one adds the quadrature components thereof together.

A clipper 212 clips the effective strength of the signal exceeding the threshold value. The signal may be a complex signal including an in-phase part and a quadrature-phase part. The strength can be expressed as energy, power or absolute amplitude. The clipper 212 may also reside before the modulators 206A to 206B.

The clipper 212 outputs the clipped signal to D/A transformer 214 which converts a signal of a digital form into a signal of an analog form. The mixer 216 up-converts the signal onto a selected radio frequency either directly or through an intermediate frequency, whereafter the signal is amplified in a power amplifier 218. The antenna 220 transmits the amplified signal as electromagnetic radiation for the user terminal(s).

A control unit 222 controls the operation of the clipper 212. The control unit 222 may control, for example, the threshold A of clipping and weights $\alpha$, $\mu$ possibly used in the method.

FIG. 3A shows a transmission signal 300 which has high peaks 302 and 304 without clipping. The vertical axis may measure amplitude or power and the horizontal axis represents time. Both axes have arbitrary scale. The threshold level is A.

FIG. 3B shows the same transmission signal 300 after the transmission signal has been clipped. The peaks 302, 304 are now lower, the highest values being about the threshold A.

FIG. 4 illustrates the clipper 212 the purpose of which is to reduce the strength of at least one peak of the transmission signal exceeding a predetermined threshold. A signal y is an input to the clipper 212 and as a vector it can be expressed as y. The signal enters a minimizer 400 which outputs an optimisation signal x which can be expressed in matrix form as x. The optimisation signal x is filtered in a filter 402 which fulfils the requirements of spectrum emission mask (SEM) of the radio system. The filter 402 can be expressed as a convolution matrix G because the filter performs a convolution based on a vector g. In a summer 404 the clipping signal Gx output by the filter 402 is subtracted from the transmission signal y which is delayed in a delay element 406. The subtraction reduces the strength of peaks in the signal y and the signal output by the summer 404 can be expressed as y−Gx=y−s. The delay element 406 delays the transmission signal y as much as the minimizer 400 and the filter 402 cause delay to the clipping signal s.

The minimizer 400 performs a minimization of a cost function with respect to the optimisation signal x. The cost function J(x) can be expressed as $$J(x) = \alpha f_1(x) + (1-\alpha) f_2(x), \quad (1)$$

where the argument x is an optimisation signal expressed in a vector form, the term $f_1(x)$ relates to an effective modulation distortion of the clipped transmission signal and the term $f_2(x)$ relates to an effective overshoot exceeding the predetermined threshold of the clipped signal, $\alpha$ and $(1-\alpha)$ are weights ($0 \leq \alpha \leq 1$) having real values. To give more weight to the second term, the weight a should be less than 0.5. The modulation distortion can also be considered as a waveform distortion.

FIG. 5 shows a simple example of a signal constellation, modulation distortion and an overshoot. The horizontal axis 500 shows a quadrature component of the modulated signal and the vertical axis 502 shows an in-phase component. Points 504, 506, 508 and 510 denote non-distorted modulation symbols (or ideal symbols) in the signal constellation. The amplitude of the non-distorted symbols may be constant but the phase varies. The number of the states in the signal constellation depends on the modulation method used: the more symbols the greater the possible data transmission capacity of the system. The small circles 512, 514, 516, 518 denote a limit L of measured symbols i.e. non-ideal symbols which are usually always distorted to some extent. The predetermined threshold A can be expressed as A=|$y_{ideal\ symbol}$|+|L|.

A pointer 520 represents the amplitude and phase of one measured symbol which can be expressed as $Re^{j(2\pi ft+\phi)}$, where R is the signal amplitude, f is a frequency, t is time and $\phi$ is a phase. An angle 522 denotes the phase $\phi$ of the symbol. The amplitude R can be defined as $R=\sqrt{(I_y^2+Q_y^2)}$, i.e. the amplitude is the square root of the sum of the square of the in-phase value and the quadrature value.

An arrow 524 denotes an acceptable error vector inside the circle 512. An arrow 526 denotes an error vector exceeding the threshold A. The complete error vector due to distortion is a sum of the error vectors 524 and 526 pointing to a symbol 504B. It can be considered that the symbol 504 is shifted from an ideal position to a displaced position 504B.

The error of the displacement can be measured as an error vector magnitude (EVM). The EVM is an indicator for the quality or distortion of modulation. The EVM defines a deviation of the measured waveform from the ideal one and it can be used to measure a single-code or a multicode signal. The peak code domain error (PCDE) can be used to define a difference between a signal and a corresponding ideal signal projected onto the code space used having a specific spreading factor, and the PCDE can be applied to multicode signals only. Hence, the PCDE is an indicator of the distribution of modulation errors over spreading codes. The error indicator EVM and PCDE are related to each other. For example, if the error is evenly distributed among the spreading codes, the PCDE can be expressed as $$PCDE = 10 \cdot \log_{10}(EVM^2/SF), \quad (2)$$

where SF denotes a spreading factor.

The term $f_1(x)$ in (1) can be expressed as $$f_1(x) = x^H G^H C^H C G x, \quad (3)$$

where the upper indices H of the terms $x^H$, $G^H$ and $C^H$ mean Hermitian forms of vectors or matrices x, G and C (the elements of a vector or a matrix $a^H$ are complex conjugates of the vector or the matrix a), and G means the convolution matrix. The matrix C may, in principle, mean a matrix B or a matrix $G^{-1}$, where the upper index −1 inverses the matrix G). The matrix B can be considered similar to a convolution matrix of a root raised cosine (RRC) filter of a measurement set up measuring the EVM. In the case the matrix C corresponds the matrix $G^{-1}$, the term $f_1(x)$ becomes $f_1(x) = x^H x$ and in this case it is not necessary to perform the part of the multiplication $G^H C^H C G$ at all, since the product $G^H C^H C G$ becomes an identity matrix I. The term $f_1(x) = x^H x$ can be accomplished by forming an effective value of the optimisation signal x.

The matrix C may also be an identity matrix I. In that case, the term $f_1(x)$ becomes $f_1(x) = x^H G^H G x$. The term $f_1(x)$ can be accomplished by filtering the optimisation signal x with a suitable FIR filter defined by the matrix G and forming an effective value of the result.

In the case the convolution matrix G is omitted, the term $f_1(x)$ becomes $f_1(x) = x^H B^H B x$. The term $f_1(x)$ can be accomplished by filtering the optimisation signal x with a suitable FIR filter (RRC filter) defined by the matrix B and forming an effective value of the result.

The term $f_1(x)$ in (1) can be expressed in a multicode system as $$f_1(x) = f(x^H G^H C_i^H C_i G x), \quad (4)$$

Here the matrix $C_i$ may, in principle, mean the matrix B, the matrix $G^{-1}$ or a product of matrices $S_i B$, where the matrix $S_i$ means a spreading code i used in a multicode radio system. The product of matrices $S_i B$ can be considered as a convolution matrix of a measurement set up measuring the PCDE. In the case of multicode signals and a PCDE measurement, the function f can be expressed as a sum $$f(x^H G^H C_i^H C_i G x) = \sum_{i=1}^{K} x^H G^H C_i^H C_i G x$$

or a maximum value $\max(x^H G^H C_i^H C_i G x)$, where K is the number of spreading codes used.

There are several possibilities to express the term $f_1(x)$ in a multicode system. In the case the matrix $C_i$ corresponds the matrix $G^{-1}$, the term $f_1(x)$ becomes $f_1(x) = x^H x$ and in this case it is not necessary to perform the part of the multiplication $G^H C_i^H C_i G$ at all, since the product $G^H C_i^H C_i G$ becomes an identity matrix I. The term $f_1(x) = x^H x$ can be accomplished by forming an effective value of the optimisation signal x.

The matrix $C_i$ may also be an identity matrix I. In that case, the term $f_1(x)$ becomes $f_1(x) = x^H G^H G x$. The term $f_1(x) = x^H$ $G^H Gx$ can be accomplished by filtering the optimisation signal x with a suitable FIR filter defined by the matrix G and forming an effective value of the result. In the case the convolution matrix G is omitted, the term $f_1(x)$ becomes $f_1(x) = x^H S_i^H B^H \underline{B} S i B x$ and the term $f_1(x)$ can be accomplished by multiplying the optimisation signal x with a spreading code and filtering the product by a root raised cosine filter defined by matrix B and forming an effective value of the result.

The term $f_2(x)$ can be expressed as $$f_2(x) = \|y - Gx - F(y - Gx, A)\|_2^2 \quad (5)$$

where the operation $\| \|_2^2$ is a length norm of the overshoot exceeding the threshold A. The non-linear function $F(y-Gx, A)$ can be defined as $$F(y - Gx, A) = \begin{cases} y - Gx & |y - Gx| \leq A \\ \dfrac{A}{|y - Gx|} & |y - Gx| > A \end{cases} \quad (6)$$

and its maximum value is limited to the threshold A. The term $f_2(x)$ defines the effective value of the error vector 526 exceeding the threshold A. The matrices B and G as filters locate in the minimizer 400. The non-linear function $F(y-Gx, A)$ can be accomplished using, for example, a CORDIC (COordinate Rotation DIgital Computer) algorithm.

The minimization $\min(J(x))$ can be performed, for example, by an iterative algorithm. The iterative algorithm may utilize a gradient descent. The minimization of the cost function with respect to argument x can now be expressed as $$\hat{x}_{n+1} = \hat{x}_n - \mu \nabla J(\hat{x}_n) \quad (7)$$

where a hat $\hat{x}$ on the variable means an estimate of the variable in the iteration, $\mu$ is a weight of the iteration ($0 \leq \mu \leq 1$) having a real number value and the differential operator $\nabla$(nabla) is a gradient (For example, in three dimensional Cartesian coordinates the nabla is $$\nabla = \frac{\partial}{\partial x} i + \frac{\partial}{\partial y} j + \frac{\partial}{\partial x} k,$$

where x, y and z are axes of Cartesian coordinates, i, j and k are unit vectors of the axis and the terms associated with the unit vectors are partial differential operators applied to a desired scalar function. The notation x, y, z, i and j should not be mixed with the variables mentioned elsewhere in the application). A gradient of a scalar function is a vector function.

The equation (7) can further be expressed as $$\hat{x}_{n+1} = \hat{x}_n - \mu [\alpha P \hat{x}_n - (1-\alpha) G^H z] \quad (8)$$

where P can be either $P = G^H C^H CG$, $P = G^H C_i^H CG$ or $P = I$. The term $P\hat{x}_n$ corresponds to the term $f_1(x)$ in (1) and the term $G^H z$ corresponds to the term $f_2(x)$ in (1). In the case the matrix C corresponds the matrix $G^{-1}$, the term $f_1(x)$ becomes $f_1(x) = x^H x$ and in this case it is not necessary to perform the part of the multiplication $G^H C^H CG$ at all, since the product $G^H C^H CG$ becomes an identity matrix I. The $i^{th}$ element of a vector z can be expressed as $$z_i = \begin{cases} y_i - g_i \hat{x}_n - A e^{j \arg(y_i - g_i \hat{x}_n)} & \text{if } |y_i - g_i \hat{x}| > A \\ 0 & \text{if } |y_i - g_i \hat{x}| \leq A \end{cases} \quad (9)$$

where $g_i$ is the $i^{th}$ row vector of the matrix G, and j is an imaginary unit fulfilling an equation $j^2 = -1$. After a number of iterations an estimate of the optimisation signal vector $\hat{x}_n$ is found and the vector $\hat{x}_n$ at least approximately minimizes the cost function $J(x)$.

The matrix G (as well as other matrices) can be realized as a finite impulse response (FIR) filter (FIG. 4, filter 402) which may be programmable in order to make the filter adaptive. FIG. 6 shows a block diagram of a FIR filter. The FIR filter comprises delay elements 600, weight units 602 and a summer 604. Each delay element 600 delays an input signal x, and the delayed signal elements $x_i$ are weighted by the desired weight coefficient $g_i$ of the weight units 602. The weighted signal elements are summed in a summer 604. Weights may be real or complex.

The iterative minimization can be considered to proceed in the following manner. Consider the situation in FIG. 5. Assume that the overshoot (arrow 526) of the transmission signal relating to the symbol 504 is clear without clipping signal. The iterative algorithm then chooses a vector x which may cause the overshoot to disappear completely. The absolute value of the first estimate of the optimisation signal vector $\hat{x}_1$ and first weighted term $\alpha f_1(\hat{x}_1)$ can be considered large in this case. The second term $(1-\alpha)f_2(\hat{x}_1)$, however, becomes zero, since the clipping signal cancels the overshoot. In the next step of iteration, the minimization decreases the value of the next estimated optimisation signal in order to decrease the value of the cost function. This may lead to the situation where a small overshoot appears. Hence, both terms $\alpha f_1(\hat{x}_2)$ and $(1-\alpha)f_2(\hat{x}_2)$ have a small value. Finally, after a number of iterations, the value of the estimated optimisation signal approaches such a situation where there is only a small overshoot or no overshoot at all and the value of $|y - G\hat{x}_n|$ is close to the threshold A.

After the cost function has been minimized and a suitable optimisation signal x has been found, a clipping signal s is formed by filtering the optimisation signal according to the spectrum emission mask requirements (filter 402 in FIG. 4) of the radio system. The clipping signal s is then subtracted from the transmission signal y by adding the clipping signal s negatively to the transmission signal in the summer 404. The requirements of the spectrum define the allowed bandwidth and the stop band attenuation, or the width of the signal frequency band.

FIG. 7A to 7C illustrate a division of the transmission signal into subsignals. To avoid processing of a large number of samples in a long transmission signal y, the transmission signal 700 in a process window can be divided into at least two subsignals 702 to 712 each having a predetermined sequential length (a predetermined number of samples). The window determines a predetermined length of the sample sequence of the transmission signal y. The cost function can be minimized with respect to the optimisation signal associated to each subsignal 702 to 712 one after another. The optimisation signal obtained in the minimization is filtered according to the spectrum emission mask by convoluting the optimisation vector x and the filtering values of vector g. The clipping signal of the form s=Gx is then subtracted from at least the subsignal which the optimisation signal is associated to.

Because of convolution, the sequence of samples of the clipping signal becomes longer than that of the subsignal which it is associated to. Hence, the clipping signal formed for one subsignal may be subtracted from many subsignals in principle. The clipping signal and its sequential length are illustrated with a segment of line 718. The length also corresponds to the convolution matrix G. In this example, the clipping signal extends from the beginning of the first subsignal 702 to the middle of the second subsignal 704. Hence, the subtraction of the first clipping signal $s_1$, which is based on the first minimization and forming of the first optimisation signal, may be performed to the first subsignal $y_1$ 702 and to the first half of the second subsignal $y_2$ 704 on which the clipping signal s has a non-zero effect.

After the first subtraction, a sequence of a new subsignal 714 is added to the end of the window and the first subsignal 702 is removed from the window as shown in FIG. 7B. The minimisation is now performed relating to the second subsignal 704. The second subsignal may be the one from which the first clipping signal has not been subtracted or the second subsignal may be the one from which the first clipping signal has been subtracted. The minimisation, the forming of optimisation signal and the subtraction are performed in the similar manner as in the case of the first subsignal. After that a sequence of the next subsignal 716 is added to the end of the transmission signal in process. The process continues in this manner as long as the transmission signal is transmitted.

The values of a previous iteration of the optimisation signal x can be used as initial values for the clipping procedure of a present subsignal.

FIG. 8 presents a flow chart of the method of clipping a transmission signal in a radio system. The transmission signal is clipped in the transmitter before transmission in order to reduce the strength of at least one peak of the transmission signal exceeding a predetermined threshold. The clipping can be performed according to the following steps. In step 800, a minimization of a cost function is performed with respect to an optimisation signal, the cost function having weighted terms as a function of the optimisation signal, the terms relating to an effective modulation distortion and an effective overshoot exceeding the predetermined threshold. In step 802, a clipping signal is formed by filtering the optimisation signal formed as a result of the minimization according to the spectrum emission mask requirements of the radio system. In step 804, the clipping signal is subtracted from the transmission signal.

The implementation can be accomplished, for example, by means of specific equipment providing the required operations, such as an application-specific integrated circuit (ASIC), or separate logic components. The implementation may also be accomplished, for example, by means of software, a base station comprising a microprocessor, where the operations of the method described above are carried out in the form of software.

In a case of software solution, a computer program product in a transmitter may encode a computer program of instructions for executing a computer process for clipping a transmission signal before transmission in order to reduce the strength of at least one peak of the transmission signal exceeding a predetermined threshold.

A computer program can be distributed in a distribution medium readable by a computer. A computer program of instructions can be encoded for executing the computer process for clipping a transmission signal in the transmitter before transmission in order to reduce the strength of at least one peak of the transmission signal exceeding a predetermined threshold.

The distribution medium of the computer program may comprise a computer readable medium, a program storage medium, a record medium, a computer readable memory, a computer readable software distribution package, a computer readable signal, a computer readable telecommunications signal, or a computer readable compressed software package.

Even though the invention is described above with reference to examples according to the accompanying drawings, it is clear that the invention is not restricted thereto but can be modified in several ways within the scope of the appended claims.

The invention claimed is:

1. A method, comprising: clipping a transmission signal in a transmitter before transmission in order to reduce a strength of at least one peak of the transmission signal exceeding a predetermined threshold; performing a minimization of a cost function with respect to an optimization signal, wherein the cost function is a function of the optimization signal, and the cost function has a first weighted term associated with an effective modulation distortion function and a second weighted term associated with an effective overshoot exceeding the predetermined threshold; forming a clipping signal by filtering the optimization signal formed as a result of the minimization according to spectrum emission mask requirements of a radio system; and subtracting the clipping signal from the transmission signal.

2. The method of claim 1, further comprising:
performing an iterative algorithm to minimize the cost function.

3. The method of claim 1, further comprising:
performing an iterative algorithm using a gradient descent to minimize the cost function.

4. The method of claim 1, further comprising:
forming a term relating to the effective modulation distortion as an effective strength of the optimization signal.

5. The method of claim 1, further comprising:
forming a term relating to the effective modulation distortion as an effective strength of the optimization signal filtered according to the spectrum emission mask requirements of the radio system.

6. The method of claim 1, further comprising:
forming a term relating to the effective modulation distortion as an effective strength of the optimization signal filtered by root raised cosine filtering.

7. The method of claim 1, further comprising:
forming a term relating to the effective modulation distortion as an effective strength of the optimization signal multiplied by a spreading code and filtered by root raised cosine filtering.

8. The method of claim 1, further comprising:
forming a term relating to the effective overshoot exceeding the predetermined threshold by forming a difference of the transmission signal and the clipping signal by subtracting the clipping signal from the transmission signal; and
forming an effective value of the difference of the transmission signal and the clipping signal when the difference of the transmission signal and the clipping signal is greater than the predetermined threshold.

9. The method of claim 1, further comprising:
processing the transmission signal in a window of a predetermined sequential length, wherein the processing comprises
dividing the transmission signal in the window into at least two subsignals of predetermined sequential lengths, performing the minimization of a cost function with respect to an optimization subsignal associated with a subsignal to form a clipping subsignal of a predetermined sublength, and subtracting the clipping subsignal from at least the subsignal with which the optimization subsignal is associated.

10. The method of claim 9, further comprising:
removing the subsignal, from which the clipping subsignal has been subtracted, from the window,
adding a new subsignal in the window, and
performing a clipping procedure on a next subsignal.

11. The method of claim 9, further comprising:
performing a clipping procedure on subsignals in the window one after another successively starting from a first subsignal.

12. The method of claim 1, further comprising:
subtracting the clipping signal from all subsignals on which the optimization subsignal has a non-zero effect.

13. An apparatus, comprising: a clipper configured to clip a transmission signal before transmission in order to reduce a strength of at least one peak of the transmission signal exceeding a predetermined threshold; a minimizer configured to minimize a cost function with respect to an optimization signal, wherein the cost function is a function of the optimization signal, and the cost function has a first weighted term associated with an effective modulation distortion function and a second weighted term associated with an effective overshoot exceeding the predetermined threshold; a filter configured to form a clipping signal by filtering the optimization signal formed as a result of a minimization according to spectrum emission mask requirements of a radio system; and a subtracter configured to subtract the clipping signal from the transmission signal.

14. The apparatus of claim 13, wherein the minimizer is further configured to perform an iterative algorithm to minimize the cost function.

15. The apparatus of claim 13, wherein the minimizer is further configured to perform an iterative algorithm using a gradient descent to minimize the cost function.

16. The apparatus of claim 13, wherein the minimizer is further configured to form a term relating to the effective modulation distortion as an effective strength of the optimization signal.

17. The apparatus of claim 13, wherein the minimizer is further configured to form a term relating to the effective modulation distortion as an effective strength of the optimization signal filtered according to the spectrum emission mask requirements of the radio system.

18. The apparatus of claim 13, wherein the minimizer is further configured to form a term relating to the effective modulation distortion as an effective strength of the optimization signal filtered by root raised cosine filtering.

19. The apparatus of claim 13, wherein the minimizer is further configured to form a term relating to the effective modulation distortion as an effective strength of the optimization signal multiplied by a spreading code and filtered by root raised cosine filtering.

20. The apparatus of claim 13, wherein the minimizer is further configured to
form a term relating to the effective overshoot exceeding the predetermined threshold by forming a difference of the transmission signal and the clipping signal by subtracting the clipping signal from the transmission signal, and form an effective value of the difference of the transmission signal and the clipping signal when the difference of the transmission signal and the clipping signal is greater than the predetermined threshold.

21. The apparatus of claim 13, wherein the clipper is further configured to process the transmission signal in a window of a predetermined length and to divide the transmission signal in the window into at least two subsignals of predetermined lengths, the minimizer is configured to perform the minimization of a cost function with respect to an optimization subsignal associated with a subsignal for forming a clipping subsignal of a predetermined sublength, and the subtracter is configured to subtract the clipping signal from at least the subsignal associated with the optimization subsignal.

22. The apparatus of claim 21, wherein the clipper is further configured to add a new subsignal in the window after a subsignal has been clipped.

23. The apparatus of claim 21, wherein the clipper is further configured to perform a clipping procedure on subsignals in the window one after another successively starting from a first subsignal.

24. The apparatus of claim 13, wherein the subtracter is further configured to subtract the clipping signal from all subsignals on which the optimization subsignal has a non-zero effect.

25. The apparatus of claim 13, wherein the apparatus is a base station.

26. An apparatus, comprising: clipping means for clipping a transmission signal before transmission in order to reduce a strength of at least one peak of the transmission signal exceeding a predetermined threshold; minimizing means for minimizing a cost function with respect to an optimization signal, wherein the cost function is a function of the optimization signal, and the cost function has a first weighted term associated with an effective modulation distortion function and a second weighted term associated with an effective overshoot exceeding the predetermined threshold; forming means for forming a clipping signal by filtering the optimization signal formed as a result of a minimization according to spectrum emission mask requirements of a radio system; and subtracting means for subtracting the clipping signal from the transmission signal.

27. A computer program embodied on a computer readable storage medium, the program configured to control a processor to perform a process, the process comprising: clipping a transmission signal in a transmitter of a radio system before transmission in order to reduce a strength of at least one peak of the transmission signal exceeding a predetermined threshold; performing a minimization of a cost function with respect to an optimization signal, wherein the cost function is a function of the optimization signal, and the cost function has a first weighted term associated with an effective modulation distortion function and a second weighted term associated with an effective overshoot exceeding the predetermined threshold; forming a clipping signal by filtering the optimization signal formed as a result of the minimization according to spectrum emission mask requirements of a radio system; and subtracting the clipping signal from the transmission signal.

* * * * *